(12) United States Patent
Cheng

(10) Patent No.: US 11,289,413 B2
(45) Date of Patent: Mar. 29, 2022

(54) WIRING BOARD AND MANUFACTURE METHOD THEREOF

(71) Applicant: Unimicron Technology Corp., Taoyuan (TW)

(72) Inventor: Shih-Liang Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/747,548

(22) Filed: Jan. 21, 2020

(65) Prior Publication Data
US 2021/0175160 A1 Jun. 10, 2021

(30) Foreign Application Priority Data
Dec. 10, 2019 (TW) .................................. 108145180

(51) Int. Cl.
*H05K 1/11* (2006.01)
*H01L 23/498* (2006.01)
*H01L 21/48* (2006.01)
*H05K 3/40* (2006.01)

(52) U.S. Cl.
CPC ...... *H01L 23/49827* (2013.01); *H01L 21/486* (2013.01); *H01L 21/4857* (2013.01); *H01L 23/49822* (2013.01); *H01L 23/49866* (2013.01); *H05K 1/11* (2013.01); *H05K 1/112* (2013.01);
(Continued)

(58) Field of Classification Search
CPC ...... H01L 23/49827; H05K 3/16; H05K 3/42;
H05K 3/113; H05K 3/0094; H05K 2201/095; H05K 2201/09463; H05K 2201/0959; H05K 2201/09545; H05K 2201/09563; H05K 2201/09609; H05K 2201/09645; H05K 2201/09654
See application file for complete search history.

(56) References Cited

U.S. PATENT DOCUMENTS 4,303,798 A * 12/1981 Paunovic ................. H05K 3/24
174/257
4,804,615 A * 2/1989 Larson .................... H05K 3/243
205/126
(Continued)

FOREIGN PATENT DOCUMENTS

CN 1984536 A 6/2007
CN 101351083 A 1/2009
(Continued)

*Primary Examiner* — Paresh H Paghadal
(74) *Attorney, Agent, or Firm* — CKC & Partners Co., LLC

(57) ABSTRACT
A wiring board and a method of manufacturing the same are provided. The method includes the following steps. A substrate is provided. The substrate is perforated to form at least one through hole. A first conductive layer is integrally formed on a surface of the substrate and an inner wall of the through hole. An etch stop layer is formed on a portion of the first conductive layer on the surface of the substrate and another portion of the first conductive layer on the inner wall of the through hole. A second conductive layer is integrally formed on the etch stop layer and the first conductive layer on the inner wall of the through hole. A plug-hole column is formed by filling with a plugged-hole material in the through hole. The second conductive layer is removed. The etch stop layer is then removed.

4 Claims, 12 Drawing Sheets

(52) U.S. Cl.
CPC ........... *H05K 1/115* (2013.01); *H05K 3/4053* (2013.01); *H05K 2201/0959* (2013.01)

(56) References Cited

U.S. PATENT DOCUMENTS

| | | | | |
|---|---|---|---|---|
| 4,830,724 | A * | 5/1989 | Houle | C23F 13/02 |
| | | | | 204/196.18 |
| 4,921,051 | A * | 5/1990 | Annen | A01B 45/02 |
| | | | | 172/21 |
| 5,235,139 | A * | 8/1993 | Bengston | H05K 3/244 |
| | | | | 174/257 |
| 5,288,541 | A * | 2/1994 | Blackwell | C23C 14/046 |
| | | | | 428/209 |
| 5,753,976 | A * | 5/1998 | Harvey | H05K 1/115 |
| | | | | 257/693 |
| 6,832,436 | B2 * | 12/2004 | Anstrom | H01L 23/50 |
| | | | | 174/261 |
| 2002/0170827 | A1 * | 11/2002 | Furuya | C25D 5/02 |
| | | | | 205/131 |
| 2003/0102160 | A1 * | 6/2003 | Gaudiello | H05K 3/244 |
| | | | | 174/262 |
| 2005/0029014 | A1 * | 2/2005 | Miura | H05K 3/426 |
| | | | | 174/262 |
| 2005/0251997 | A1 * | 11/2005 | Homg | H05K 3/4602 |
| | | | | 29/830 |
| 2007/0130761 | A1 * | 6/2007 | Kang | H05K 3/0094 |
| | | | | 29/830 |
| 2008/0196935 | A1 | 8/2008 | Sidhu et al. | |
| 2009/0297873 | A1 * | 12/2009 | Yum | H05K 1/116 |
| | | | | 428/596 |
| 2014/0345916 | A1 * | 11/2014 | Park | H05K 3/108 |
| | | | | 174/255 |
| 2016/0099201 | A1 | 4/2016 | Choi et al. | |
| 2016/0252271 | A1 * | 9/2016 | Nielsen | H05B 1/0297 |
| | | | | 392/466 |
| 2017/0008450 | A1 * | 1/2017 | Jeong | B60T 7/042 |
| 2018/0110118 | A1 * | 4/2018 | Li | H05K 1/0283 |

FOREIGN PATENT DOCUMENTS

| | | |
|---|---|---|
| CN | 101677493 B | 12/2011 |
| CN | 104053305 A | 9/2014 |
| TW | 200538000 A | 11/2005 |
| TW | 200742005 A | 11/2007 |
| TW | 200812026 A | 3/2008 |
| TW | 201012328 A | 3/2010 |
| TW | 201023319 A | 6/2010 |
| TW | 201029133 A | 8/2010 |

* cited by examiner

WIRING BOARD AND MANUFACTURE METHOD THEREOF

CROSS-REFERENCE TO RELATED APPLICATION

This application claims priority to Taiwan Application Serial Number No. 108145180, filed Dec. 10, 2019, which is herein incorporated by reference.

BACKGROUND

Field of Invention

The present disclosure relates to a field of a wiring board, and in particular, to a wiring board with a conductive layer which is thin on surface of the board and thick on inner wall of the through hole, and a method of manufacturing the same.

Description of Related Art

With the vigorous development of the electronics industry, electronic products have gradually entered the multi-functional and high-performance research and development direction. In order to meet the requirements of high integration and miniaturization of semiconductor components, various requirements of wiring boards are also getting higher and higher. Multilayer wiring boards are often provided with through holes, and a conductive layer is disposed in the through holes and connected to the conductive layer on the surface of the base material, so as to communicate the signals of the layers. Serious insertion loss and impedance matching issues will occur on 5G high-frequency high-speed wiring boards while the thickness variation of the conductive layer is too high and the conductive layer is too thick during the manufacturing process.

As the application of wiring boards becomes more and more widespread, how to provide wiring boards that can arbitrarily adjust the thickness of conductive layer according to different needs and can also reduce the thickness variation of the conductive layer on the through hole of the multilayer wiring board is an urgent issue to be solved.

SUMMARY

In order to achieve the above object, one object of the present disclosure is to provide a method of manufacturing a wiring board, which includes the following steps. A substrate is provided. At least one through hole is formed in the substrate. A first conductive layer is formed on a surface of the substrate and an inner wall of the through hole, in which the first conductive layer on the surface and the inner wall is integrally formed. An etch stop layer is formed on a portion of the first conductive layer on the surface of the substrate and a portion of the first conductive layer on the inner wall of the through hole. A second conductive layer is formed on the etch stop layer and the first conductive layer on the inner wall of the through hole, in which the second conductive layer on the etch stop layer and the inner wall is integrally formed. A plugged-hole material is filled in the through hole to form a plug-hole column. The second conductive layer is removed. The etch stop layer is then removed.

According to one embodiment of the present disclosure, the substrate is formed by laminating a plurality of base materials.

According to one embodiment of the present disclosure, before forming the first conductive layer, the method further includes removing a metal material on a surface of the substrate.

According to one embodiment of the present disclosure, a material of the first conductive layer is copper.

According to one embodiment of the present disclosure, a material of the etch stop layer is different from a material of the first conductive layer.

According to one embodiment of the present disclosure, forming the etch stop layer further includes simultaneously forming the etch stop layer on a portion of the first conductive layer on the inner wall of the through hole.

According to one embodiment of the present disclosure, forming the etch stop layer includes sputtering a metal on the first conductive layer to form the etch stop layer by using a sputtering method.

According to one embodiment of the present disclosure, the metal includes titanium, zinc, cobalt, chromium, or a combination thereof.

According to one embodiment of the present disclosure, a material of the second conductive layer is the same as a material of the first conductive layer.

According to one embodiment of the present disclosure, after the plug-hole column is formed, the method further includes removing a portion of the plugged-hole material which is over the plug-hole column and protruding on a portion of the second conductive layer, so that the plug-hole column is coplanar with the second conductive layer.

According to one embodiment of the present disclosure, removing the second conductive layer includes removing the second conductive layer by grinding.

According to one embodiment of the present disclosure, removing the etch stop layer includes removing the etch stop layer by using a wet etching method, in which the etchant used in the wet etching method is unable to remove the first conductive layer.

According to one embodiment of the present disclosure, after removing the etch stop layer, the method further includes forming a third conductive layer on the first conductive layer and the plug-hole column.

In order to achieve the above object, another object of the present disclosure is to provide a wiring board, which includes a substrate, at least one through hole, a conductive layer, and a plug-hole column. The through hole is penetrating through the substrate. The conductive layer is disposed on a surface of the substrate and an inner wall of the through hole, in which a portion of connection of the conductive layer on the surface and the inner wall is integrally formed. The plug-hole column is filled in the at least one through hole, and the conductive layer is disposed between the substrate and the plug-hole column.

According to one embodiment of the present disclosure, the substrate includes a multilayer board.

According to one embodiment of the present disclosure, a thickness of the conductive layer on the inner wall of the through hole is greater than a thickness of the conductive layer on the surface of the substrate.

According to one embodiment of the present disclosure, a material of the conductive layer is copper.

According to one embodiment of the present disclosure, a portion of the conductive layer located on a surface of an inner wall of an edge of the through hole includes a sputtering material.

According to one embodiment of the present disclosure, the sputtering material includes titanium, zinc, cobalt, chromium, or an alloy thereof.

According to one embodiment of the present disclosure, a material of the plug-hole column is an insulating material.

The foregoing summary is intended to provide a simplified summary of the present disclosure so that readers may have a basic understanding of the present disclosure. This summary is not a comprehensive overview of the disclosure, and it is not intended to indicate important/critical features of the embodiments of the present disclosure or to define the scope of the present disclosure.

BRIEF DESCRIPTION OF THE DRAWINGS

In order to make the above and other objects, features, advantages and embodiments of the present disclosure more comprehensible, the description of the drawings is as follows.

DETAILED DESCRIPTION

Figure 1:
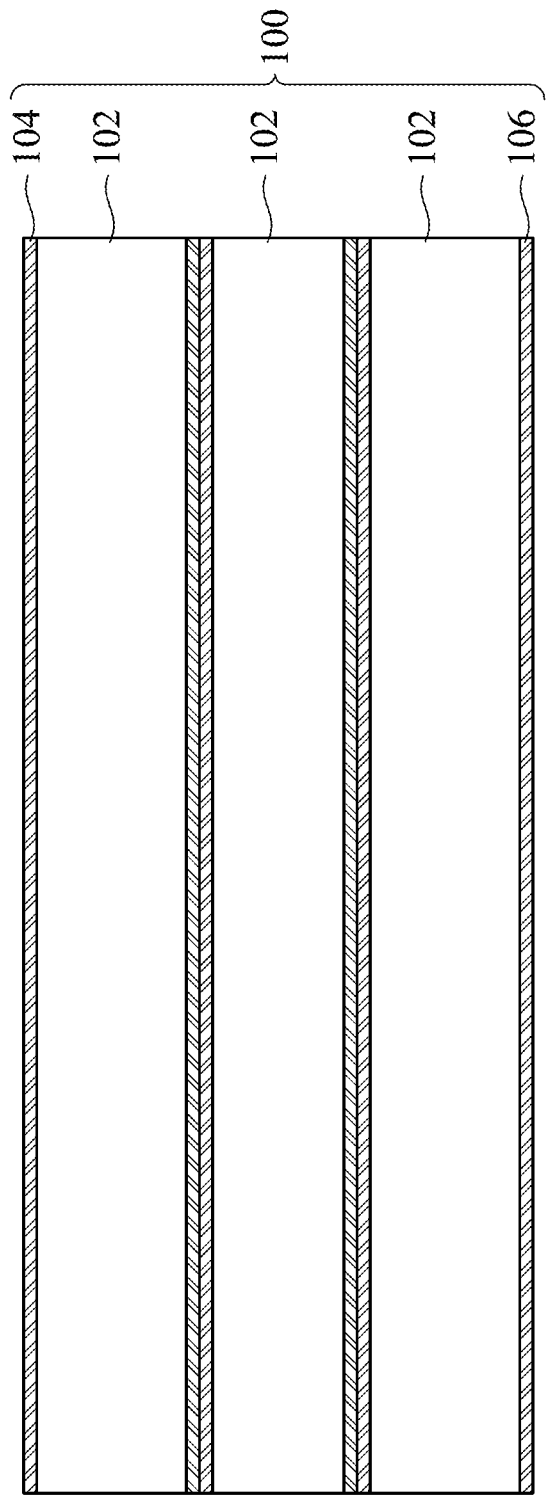
FIG. 1 to FIG. 10 are schematic side views of a method of manufacturing a wiring board at various stages according to an embodiment of the present disclosure.

In order that the present disclosure is described in detail and completeness, implementation aspects and specific embodiments of the present disclosure with illustrative description are presented, but it is not the only form for implementation or use of the specific embodiments of the present disclosure. The embodiments disclosed herein may be combined or substituted with each other in an advantageous manner, and other embodiments may be added to an embodiment without further description. The singular term used herein includes plural referents unless the context clearly dictates otherwise. By reference to a specific reference to "an embodiment", at least one of embodiments of the present disclosure shows a particular feature, structure or characteristic, such that when the specific reference "in one embodiment" is made, it is not necessary to refer to the same embodiment, and further, in one or more embodiments, these particular features, structures, or characteristics may be combined with each other as appropriate.

In the following description, numerous specific details will be described in detail in order to enable the reader to fully understand the following embodiments. However, the embodiments of the present disclosure may be practiced without these specific details. In other instances, well-known structures and devices are only schematically illustrated in the drawings in order to simplify the drawings.

The terms used throughout the context generally represent their usual meanings, as some special terms will be specifically defined below to provide additional guidance for practitioners. For convenience, certain terms may be specifically marked, such as using italics and/or quotes. Whether it is specifically marked or not, the scope and meaning of the term is not affected in any way, and it is the same as the scope and meaning of ordinary term. It is understandable that the same thing can be described in more than one way. As such, alternative languages and synonyms for one or more terms may be used herein, and they are not intended to illustrate that a term discussed in this article has any special meaning. Synonyms for certain terms will be used, and repeated use of one or more synonyms does not preclude the use of other synonyms. Any illustrations discussed in this specification are for illustrative purposes only and do not in any way limit the scope and meaning of this disclosure or its illustrations. As such, the disclosure is not limited to the various embodiments set forth in this specification.

As used herein, unless the context specifically dictates otherwise, "a" and "the" may mean a single or a plurality. It will be further understood that "comprise", "include", "have", and similar terms as used herein indicate features, integers, steps, and/or operations stated herein, but not exclude additional features, integers, steps, and/or operations.

As used herein, "about" is generally an error or range of a numerical value within about 20 percent, preferably within about 10 percent, and more preferably within about 5 percent. Unless explicitly stated in the context, the numerical values mentioned are regarded as approximate values, that is, errors or ranges indicated by "about".

One aspect of the present disclosure is to provide a method of manufacturing a wiring board. FIG. 1 to FIG. 10 are schematic side views of a method of manufacturing a wiring board at various stages according to an embodiment of the present disclosure.

First, referring to FIG. 1, a substrate 100 is provided. The substrate 100 is formed by laminating a plurality of base materials 102, or a multilayer board may be used. A surface of the substrate 100 disclosed below may be a first surface 104 or/and a second surface 106. In some embodiments, the surface of the substrate 100 includes a copper foil.

Figure 2:
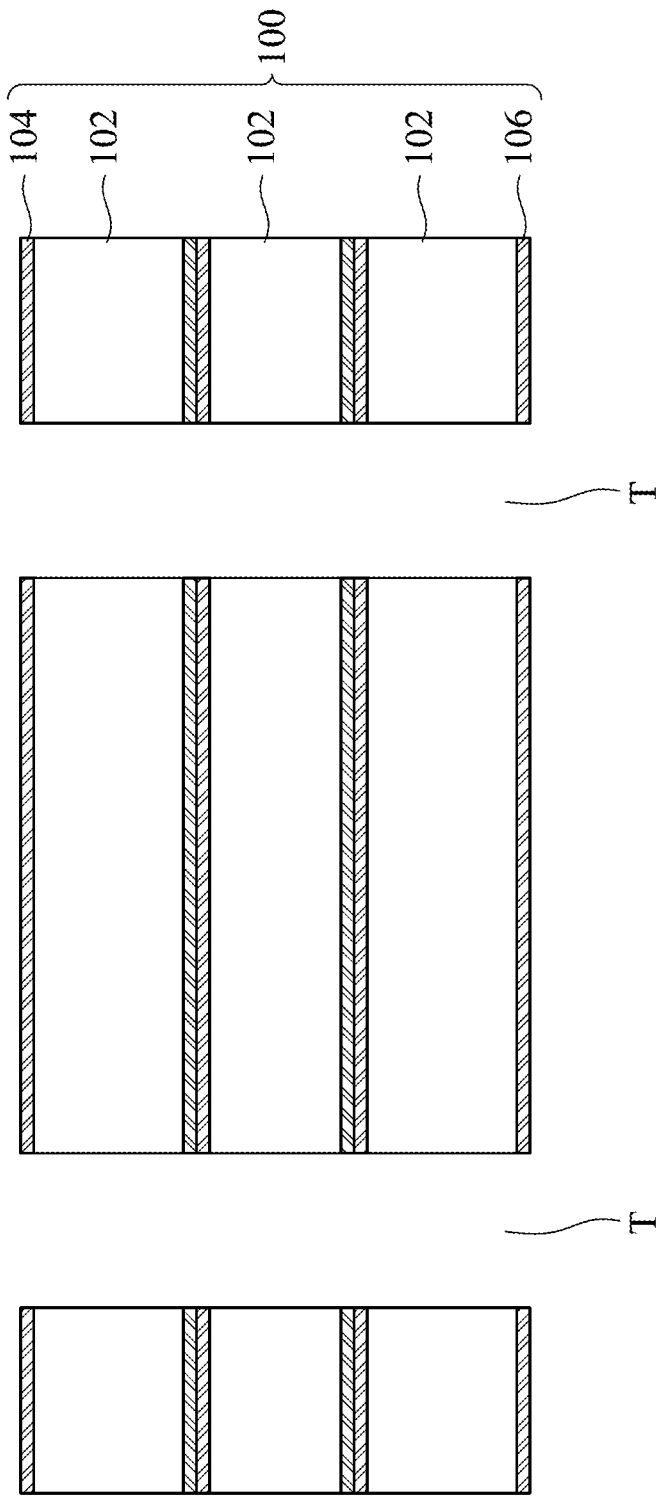

Subsequently, referring to FIG. 2, the substrate 100 is perforated through to form at least one through hole T in the substrate 100. The method of forming the through hole T may include mechanical drilling or other suitable perforating methods.

Figure 3:
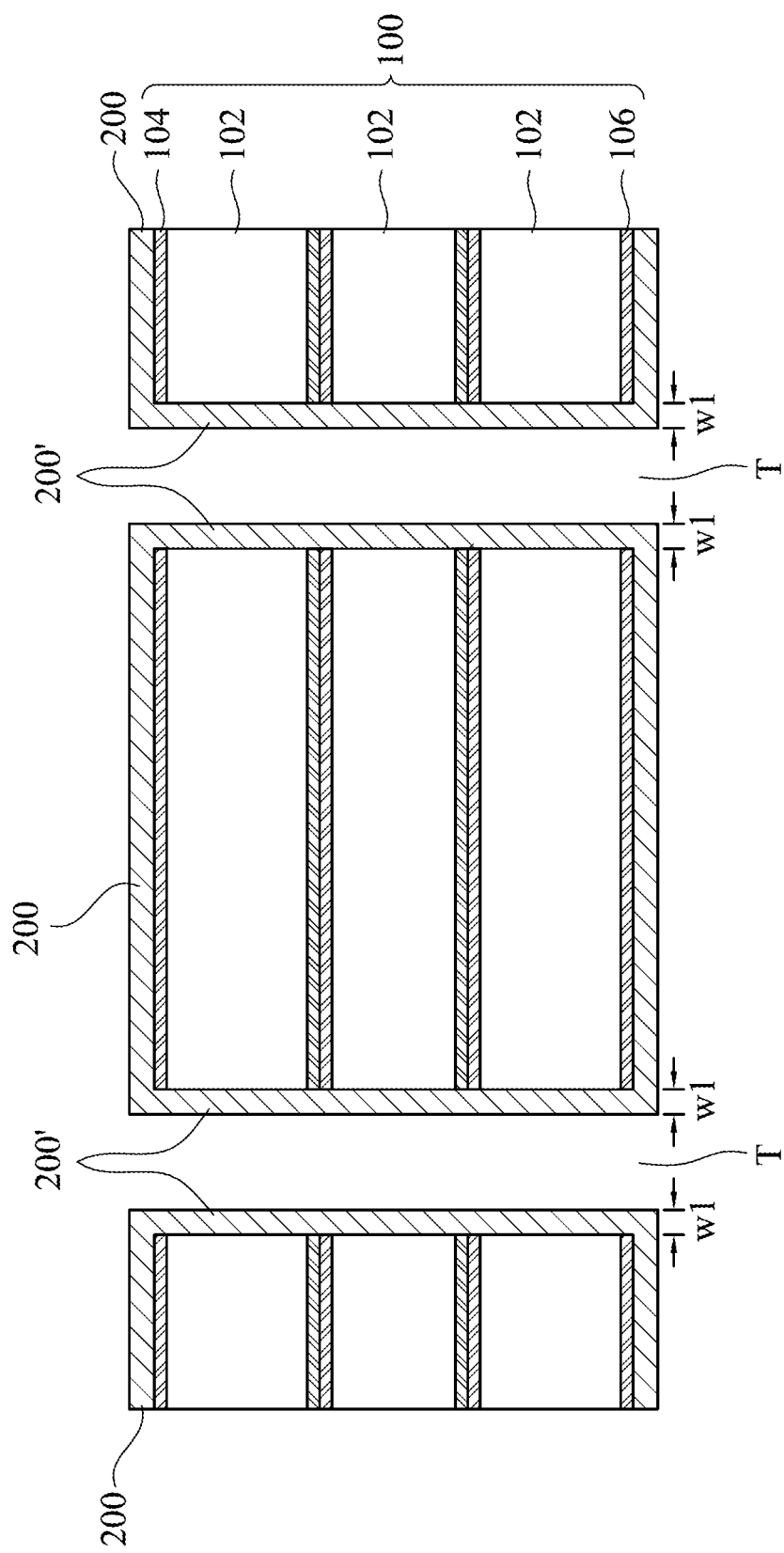

Next, referring to FIG. 3, a first conductive layer 200 is formed on the surface of the substrate and an inner wall of the through hole (the first conductive layer 200 on the inner wall of the through hole is referred to the first conductive layer 200'). In an embodiment of the present disclosure, in particular, the first conductive layer 200 on the surface of the substrate 100 and the inner wall of the through hole T is integrally formed. This process can reduce the thickness variation of the first conductive layer 200, thereby reducing the signal variation of the wiring board to improve the stability of the wiring board and have better structural strength of the conductive layer, as compared with the case where the conductive layer is separately coated on the surface of the substrate 100 and the inner wall of the through hole T, and a connection is not integrally formed. In some embodiments, before forming the first conductive layer 200, a metal material on the surface of the substrate, such as a copper foil, may be removed by chemical mechanical polishing or etching. In some embodiments, the method of forming the first conductive layer 200 is, for example, electroplating. A material of the first conductive layer is, for example, copper. A thickness of the first conductive layer 200 is at least 5 μm, such as 5 μm to 20 μm, but not limited thereto.

Figure 4:
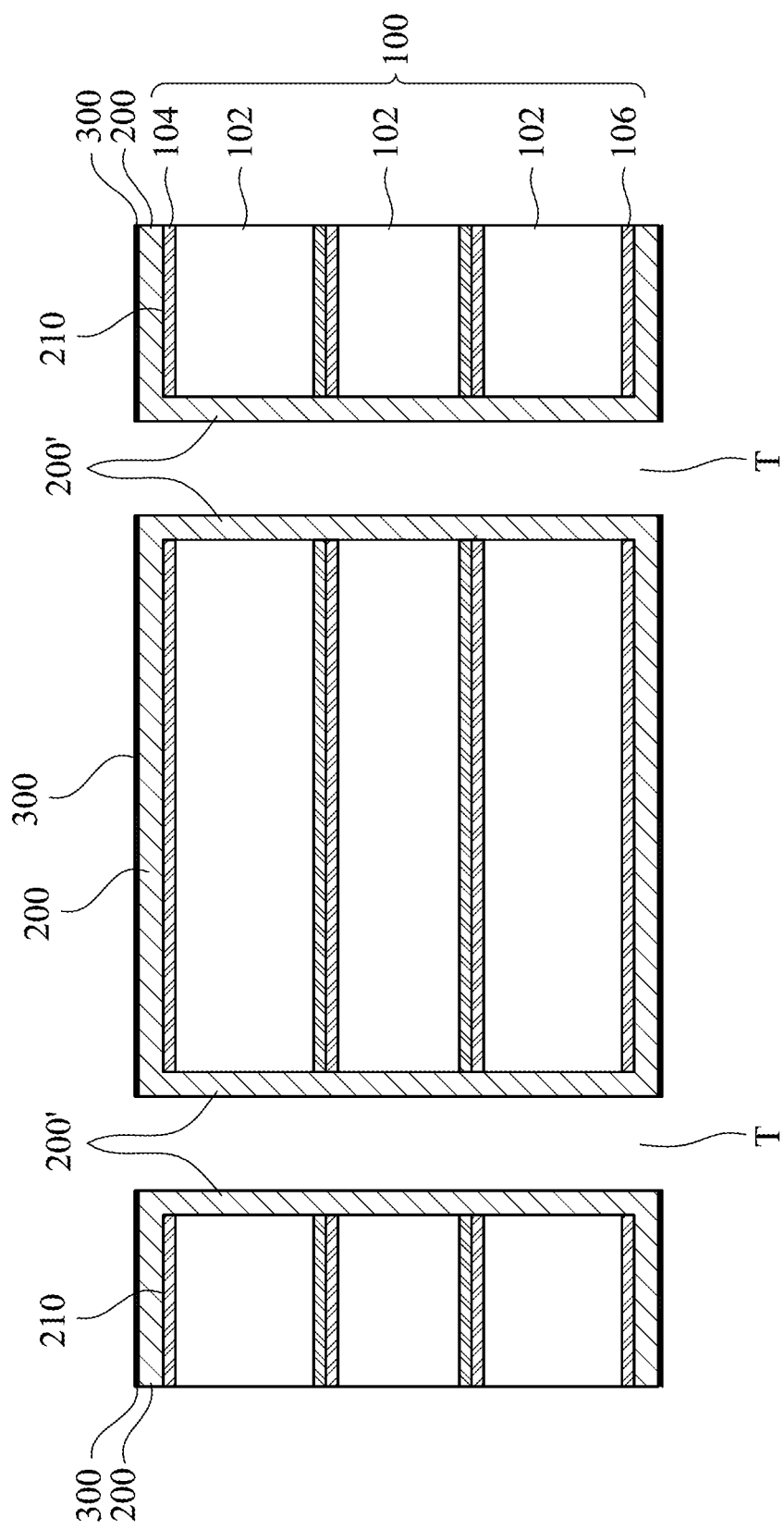

Next, referring to FIG. 4, an etching stop layer 300 is formed on the first conductive layer 200 on the surface of the substrate 100. In some embodiments, forming the etch stop layer 300 includes sputtering or other suitable deposition techniques for depositing one or more metals different from the material of the first conductive layer 200 on a portion of the first conductive layer 200 on the surface of the substrate 100 and on a portion of the first conductive layer 200' on the inner wall of the through hole simultaneously. The metal may be titanium, zinc, cobalt, chromium, or a combination thereof. It is worth mentioning that, compared with the electroplating method, forming the etch stop layer 300 by using the sputtering method can reduce the content of the etch stop layer 300 remaining on the first conductive layer 200 on the inner wall of the through hole T, and a thickness of the etch stop layer 300 formed by using the sputtering method is much less than that formed by using the electroplating method, resulting in better stability of the wiring board.

Figure 5:
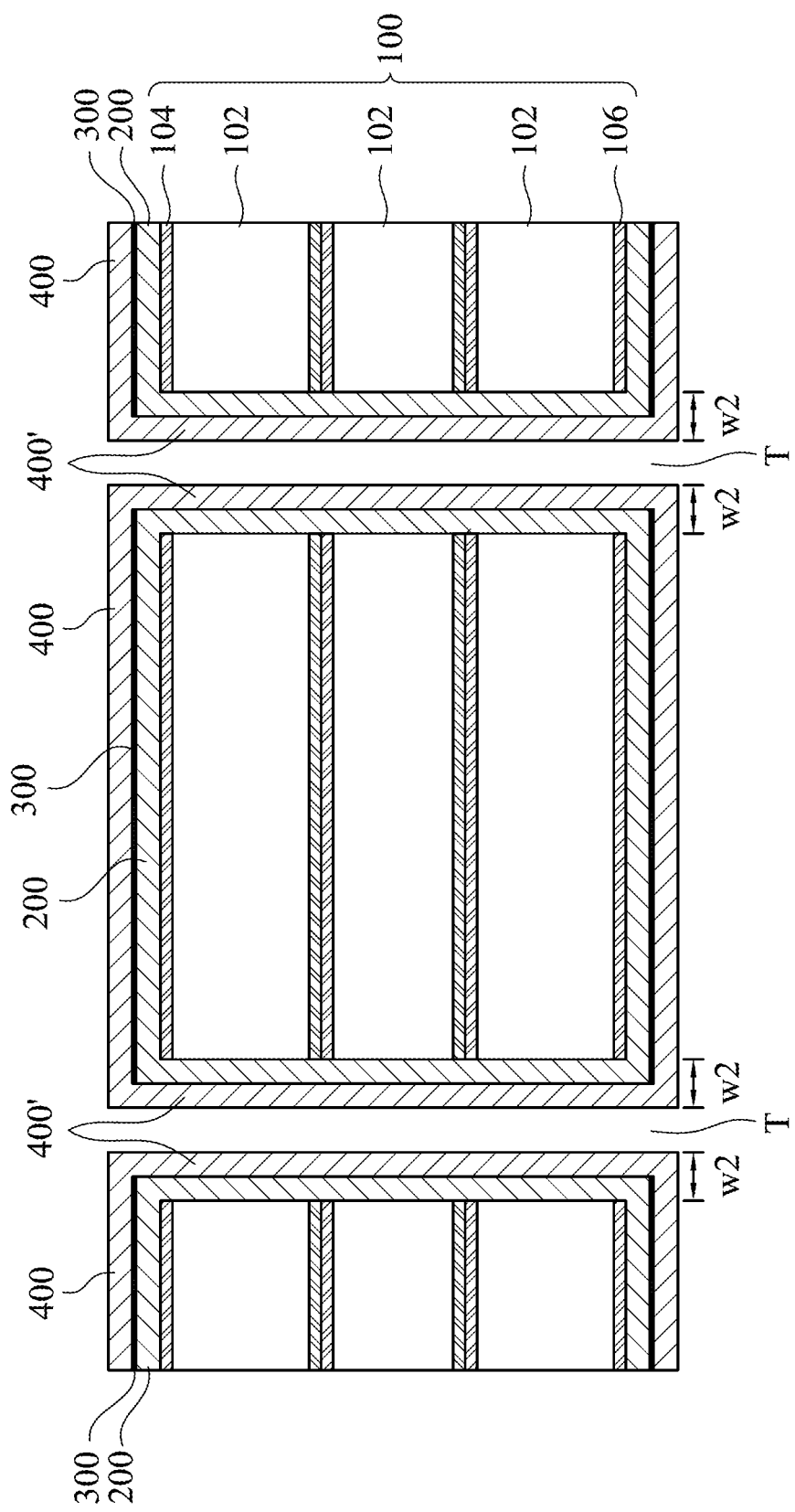

Next, referring to FIG. 5, a second conductive layer 400 is formed on the etch stop layer 300 and the first conductive layer 200' on the inner wall of the through hole T (see also FIG. 4). The second conductive layer 400 on the etch stop layer 300 and the inner wall is integrally formed. In some embodiments, a method of forming the second conductive layer 400 is, for example, electroplating. In some embodiments, a material of the second conductive layer is the same as that of the first conductive layer 200, such as copper. It should be emphasized that the conductive layer in the through hole T composited with the second conductive layer 400, the second conductive layer 400', and the second conductive layer 400 on the first conductive layer 200' on the inner wall of the through hole T has a thickness w2 greater than a thickness w1 of the first conductive layer 200 on the surface of the substrate 100 and the first conductive layer 200' in the through hole T (see also FIG. 3), such as 10 μm to 50 μm, thus to meet the requirement of increase of the thickness of the conductive layer in the through hole T.

Figure 6:
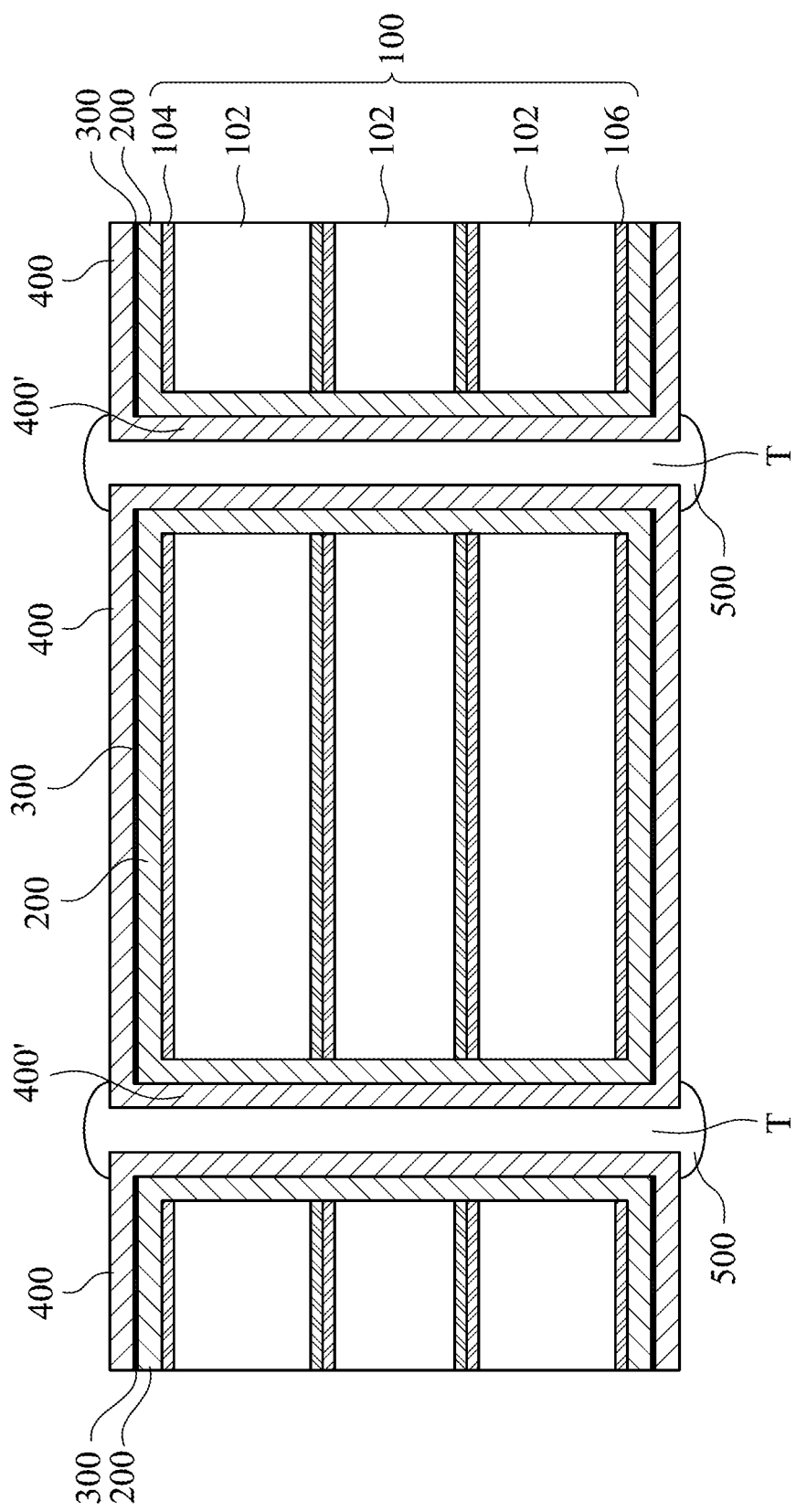
Figure 7:
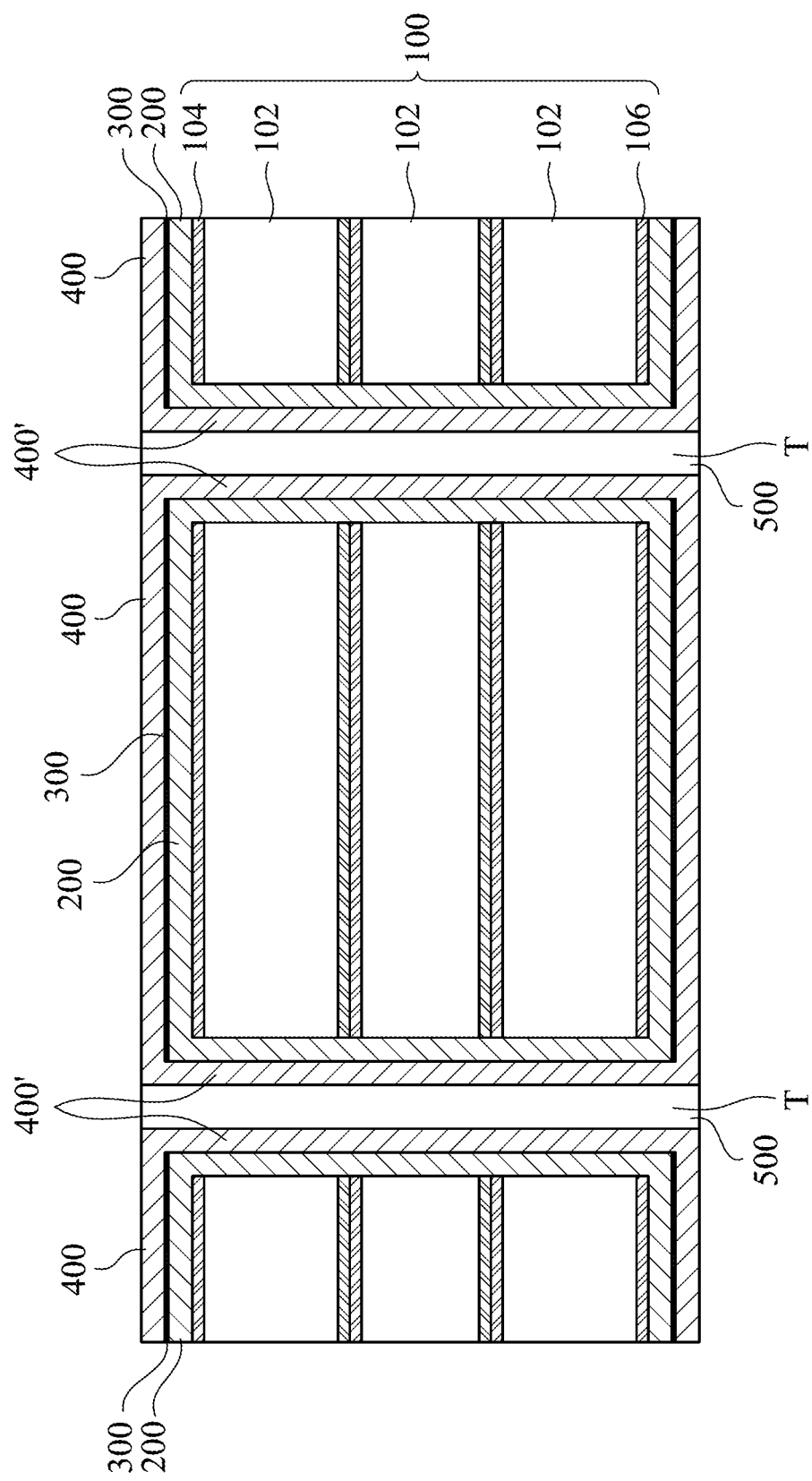

Next, referring to FIG. 6, a plugged-hole material is filled in at least one through hole T to form a plug-hole column 500. In some embodiments, the plug-hole column 500 protrudes out of the through hole T and partially extends to a surface of the second conductive layer 400 at the periphery of an edge of the through hole to closely fit the through hole T. In some embodiments, the plugged-hole material is an insulating material, such as resin. In some embodiments, please refer to FIG. 7, after the plug-hole column 500 is formed, the portion of plugged-hole material over the plug-hole column 500 and protruding on a portion of the second conductive layer 400 is removed, so that the plug-hole column 500 is coplanar with the second conductive layer 400.

Figure 8:
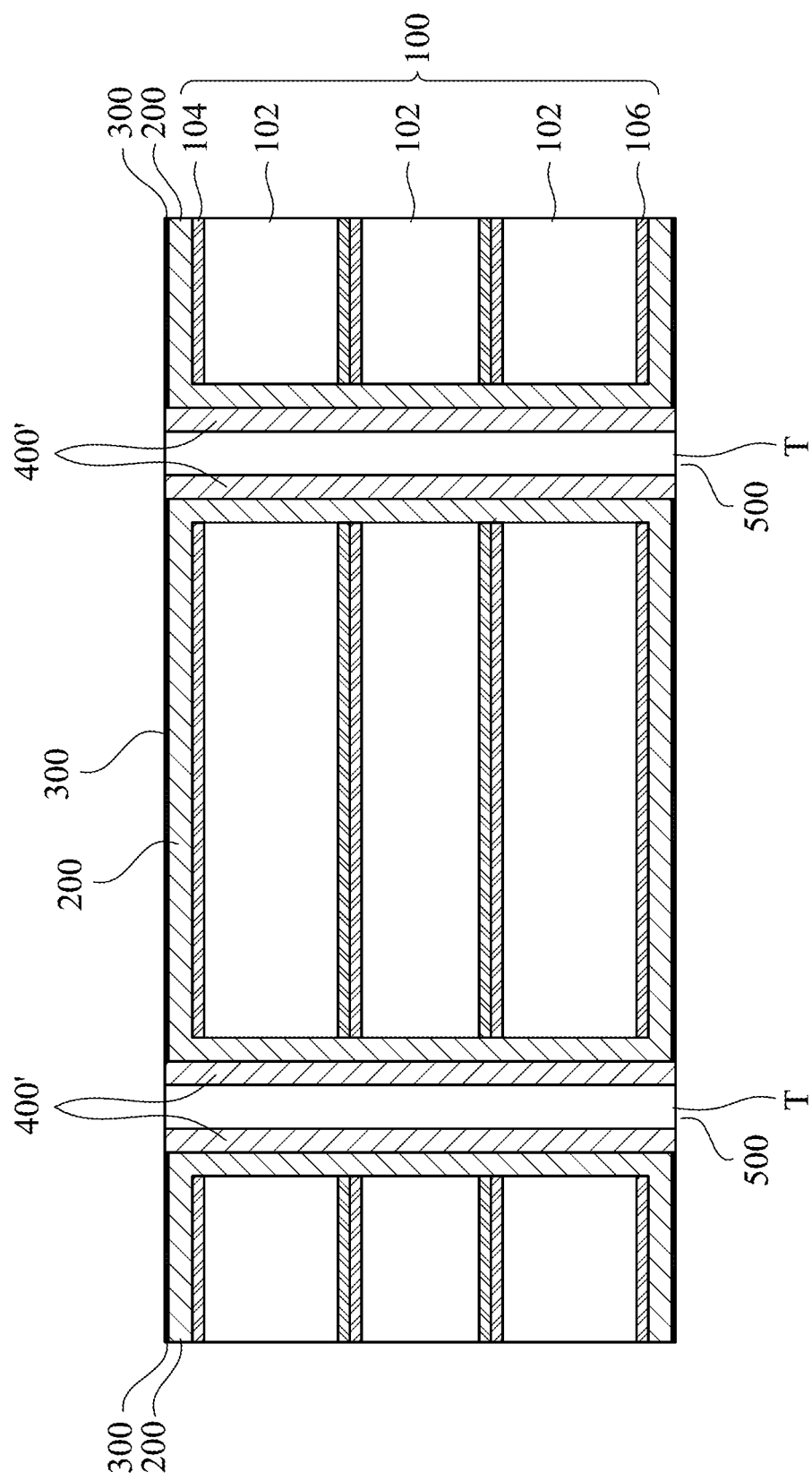

Next, in order to reduce the thickness of the conductive layer on the surface of the substrate 100, referring to FIG. 8, the second conductive layer 400 is removed to expose the etching stop layer 300, and the surface of the etching stop layer 300 is flush. In some embodiments, the method of removing the second conductive layer 400 includes grinding, such as physical polishing (such as brush polishing) or chemical mechanical polishing, or etching, such as wet etching. It should be emphasized that when the wet etching method is used, an etchant used for etching the second conductive layer 400 has selectivity, that is, the etchant stops the etching effect after the second conductive layer is removed, and does not continue to affect the etching stop layer 300. In some embodiments, a material of the etch stop layer 300 is titanium, which is generally visually white and can be used as a reference for observing the etching effect during the removal of the second conductive layer 400. In some embodiments, when the wet etching method is used, after the second conductive layer 400 is removed, a portion of the plugged-hole column material protruding from the surface of the etch stop layer 300 is also removed subsequently, so that the plug-hole column 500 is coplanar with the etch stop layer 300.

Figure 9:
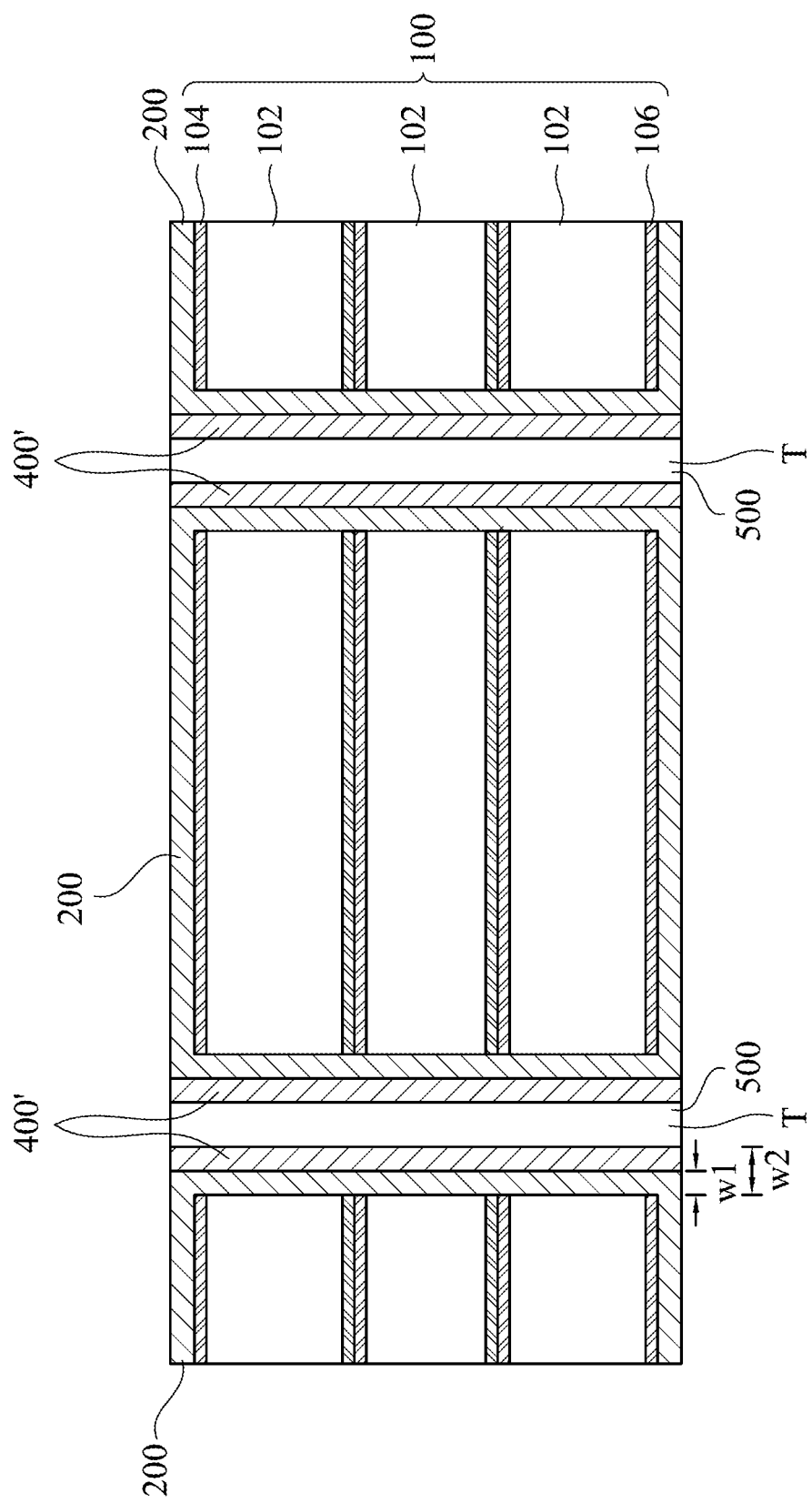
Figure 10:
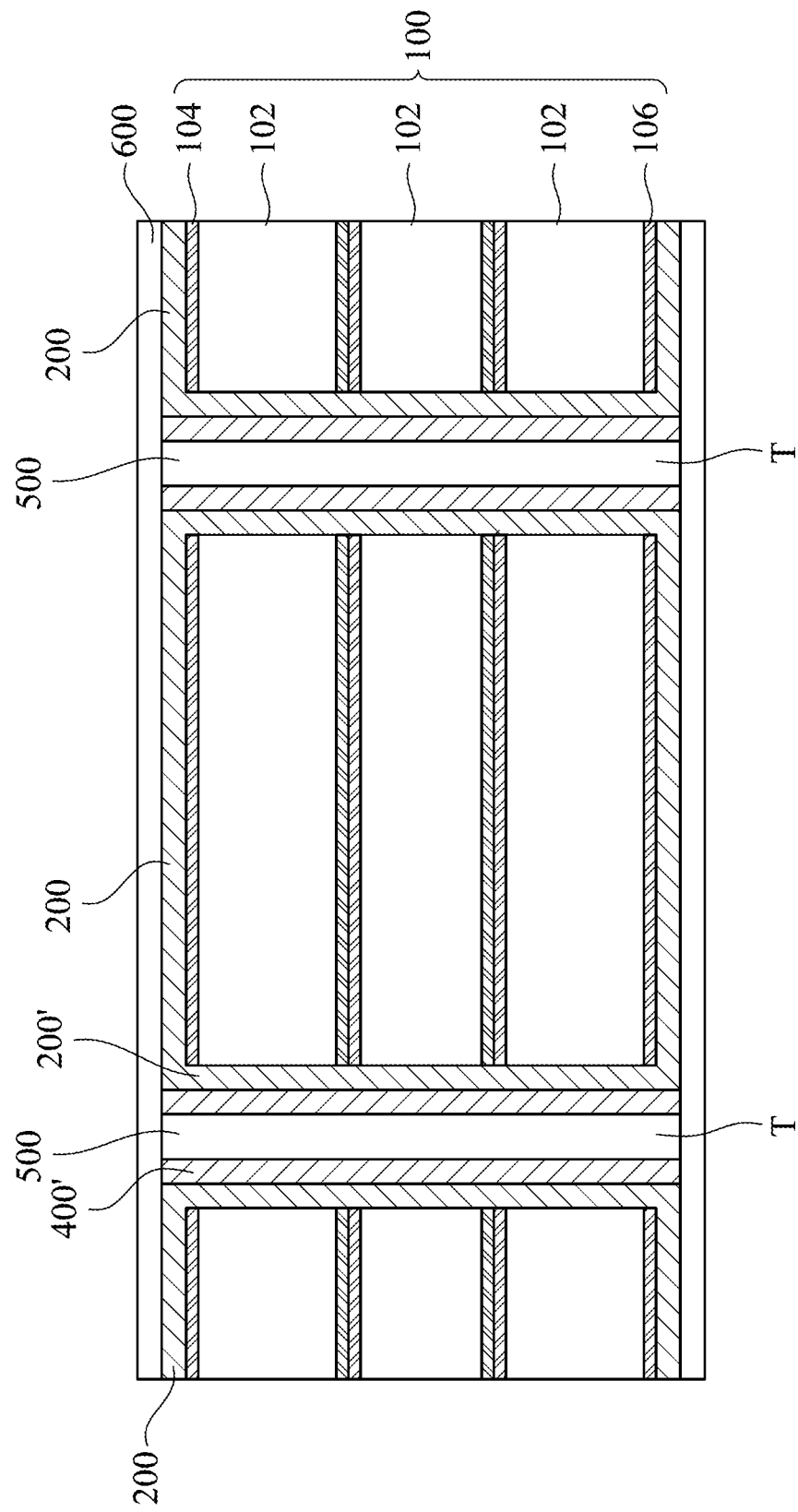

Next, referring to FIG. 9, the etch stop layer 300 is removed to expose the first conductive layer 200. Since the thickness of the etch stop layer 300 is ultrathin and can be negligible, the first conductive layer 200 is substantially coplanar with the second conductive layer 400'. In some embodiments, the wet etching method is used to remove the etch stop layer 300, and an etchant of the wet etching method has selectivity that the first conductive layer 200 cannot be removed to avoid affecting the thickness of the conductive layer. In some embodiments, after the etching stop layer 300 is removed, a third conductive layer 600 can be formed on the first conductive layer 200 and the plug-hole column 500, which can be used for subsequent formation of a surface patterned circuit layer of the wiring board.

As can be seen from the foregoing, one embodiment of the present disclosure is to improve the manufacturing process of the wiring board to fabricate the wiring board having the through hole T. The process of integrally forming the first conductive layer 200 can reduce variation of the thickness of the conductive layer to less than ±10 μm, thereby reducing the signal variation of the wiring board to improve the stability of the wiring board. In addition, by using the design of the etch stop layer, it is possible to increase the thickness of the conductive layer on the inner wall of the through hole T without increasing the thickness of the conductive layer on the surface of the substrate 100 to meet the requirement of the wiring board with the thin conductive layer on the surface of the substrate and the thick conductive layer on the inner wall of the through hole.

Another aspect of the present disclosure is to provide a wiring board. Referring to FIG. 9, the wiring board includes a substrate 100, at least one through hole T, a conductive layer (i.e., a first conductive layer 200 and a portion of a second conductive layer 400'), and a plug-hole column 500. The through hole T is through the substrate 100. The conductive layer is disposed on a surface of the substrate 100 (e.g., a first surface 104 or/and a second surface 106, and the first conductive layer 200) and an inner wall of the through hole T (i.e., the first conductive layer 200' and the portion of the second conductive layer 400'), and a connection of the portion of the conductive layer on the surface of the substrate 100 (i.e., the first conductive layer 200) and the portion thereof on the inner wall of the through hole T (i.e., the first conductive layer 200', see also FIG. 10) is integrally formed. The plug-hole column 500 is filled in the through hole T, and the conductive layer is disposed between the substrate 100 and the plug-hole column 500.

In some embodiments, the substrate includes a single-layer board or a multilayer board.

In some embodiments, a thickness w2 of the conductive layer in the through hole is greater than a thickness of the conductive layer on the surface of the substrate. In some embodiments, a material of the conductive layer is copper.

It is worth mentioning that one or more components different from the material of the conductive layer can be detected at a portion between the first conductive layer and the second conductive layer on the surface of the inner wall of the edge of the through hole through elemental analysis method. In some embodiments, the aforementioned component is a sputtering raw material used for forming the etch stop layer, such as titanium, zinc, cobalt, chromium, or an alloy thereof.

In some embodiments, a material of the plug-hole column 500 is an insulating material.

Figure 11:
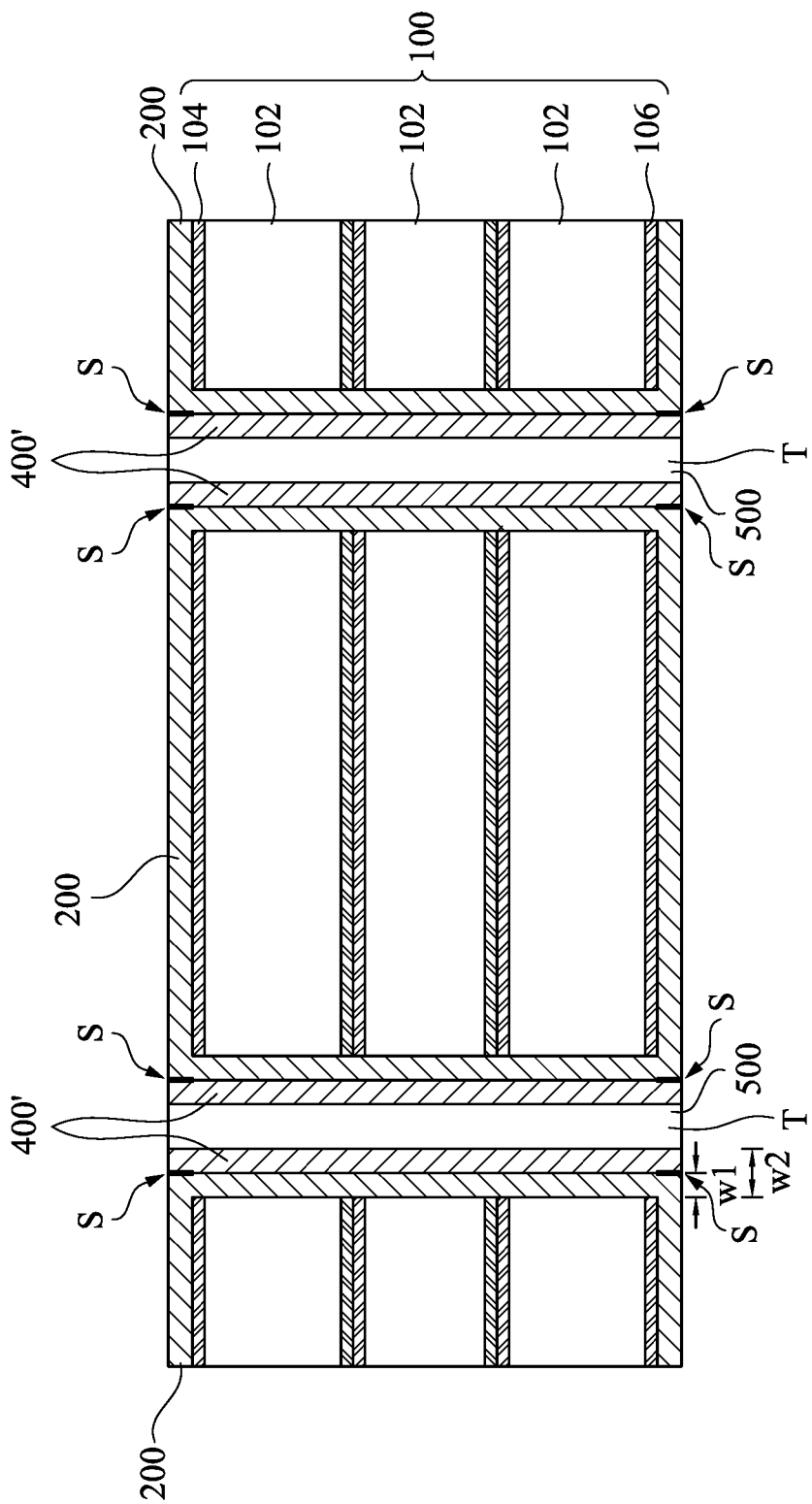
FIG. 11 to FIG. 12 are schematic side views of a wiring board according to another embodiments of the present disclosure.
Figure 12:
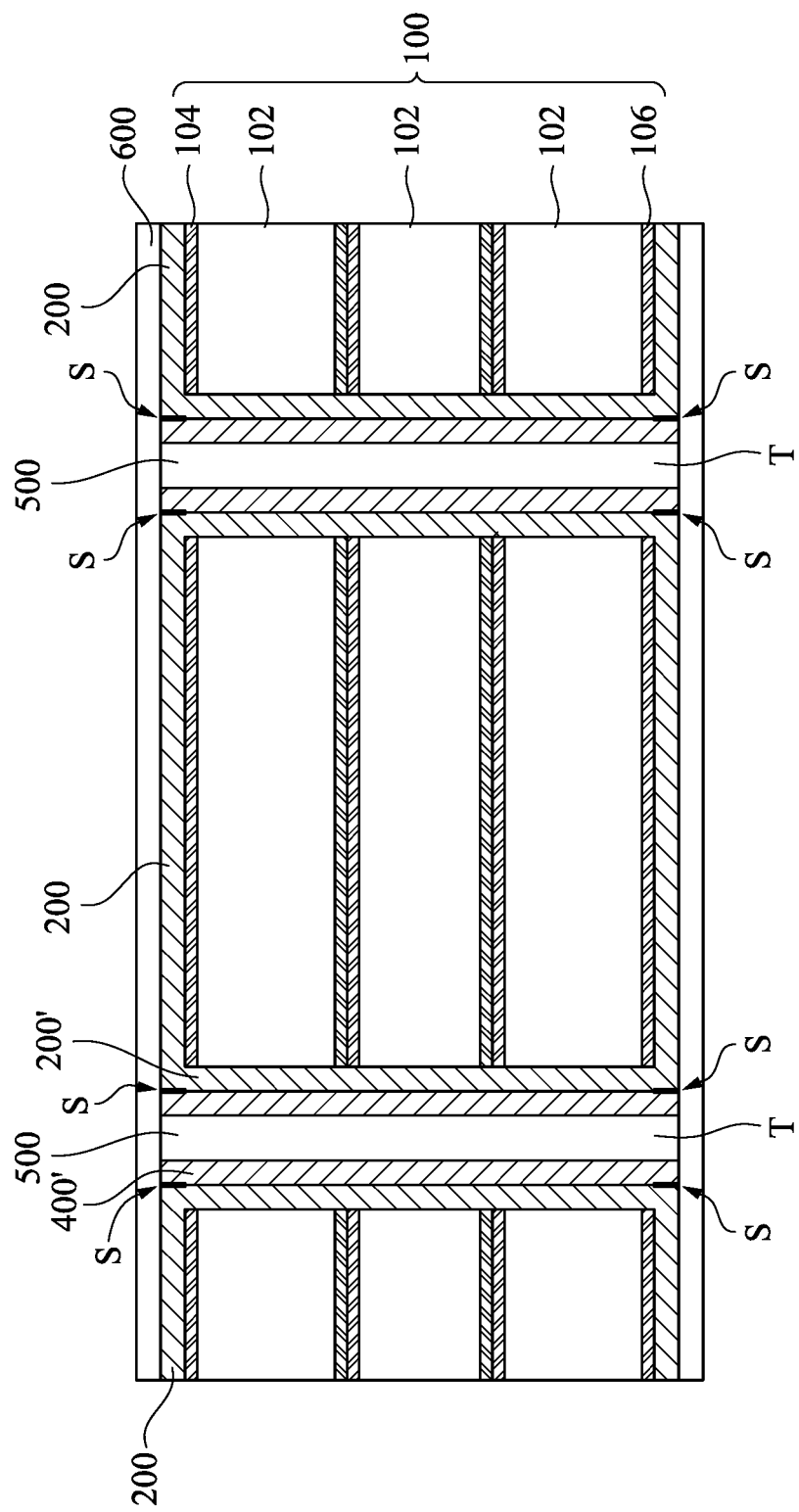

In another embodiments, referring to FIGS. 11 to 12, one or more components S extends from a corner of first conductive layer 200 to a location of first conductive layer 200 corresponding to the through hole T (such as corresponding to the edge of the through hole T).

Although the disclosure has been disclosed in the above embodiments, it is not intended to limit the disclosure, and it is to be understood that those skilled in the art can make various changes and modifications without departing from the spirit and scope of the disclosure. The scope of protection of the present disclosure is subject to the definition of the scope of claims.

What is claimed is:

1. A wiring board, comprising:
a substrate;
at least one through hole through the substrate;
a first conductive layer disposed on a surface of the substrate and an inner wall of the through hole, wherein a portion of connection of the first conductive layer on the surface and the inner wall is integrally formed,
a second conductive layer only disposed on the first conductive layer located on the inner wall of the through hole, wherein a total thickness combining a thickness of the first conductive layer and a thickness of the second conductive layer on the inner wall of the through hole is greater than a thickness of the first conductive layer on the surface of the substrate; and
a plug-hole column filled in the at least one through hole, wherein a material of the plug-hole column is an insulating material, and a portion of the first conductive layer and the second conductive layer are disposed between the inner wall of the through hole and the plug-hole column,
wherein a sputtering material is disposed only between the portion of the first conductive layer on a surface of an edge of the inner wall of the through hole and the second conductive layer, wherein the sputtering material is different from the material of the first conductive layer and the second conductive layer.

2. The wiring board of claim 1, wherein the substrate comprises a multilayer board.

3. The wiring board of claim 1, wherein a material of the first conductive layer and the second conductive layer is copper.

4. The wiring board of claim 1, wherein the sputtering material comprises titanium, zinc, cobalt, chromium, or an alloy thereof.

* * * * *